(12) United States Patent
Hsu

(10) Patent No.: US 7,671,580 B2
(45) Date of Patent: Mar. 2, 2010

(54) INTEGRATED CURRENT SENSING TRANSFORMER AND CURRENT SENSING CIRCUIT USING SUCH TRANSFORMER

(75) Inventor: Wen-Kuan Hsu, Taoyuan (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 223 days.

(21) Appl. No.: 11/564,978

(22) Filed: Nov. 30, 2006

(65) Prior Publication Data
US 2008/0106252 A1      May 8, 2008

(30) Foreign Application Priority Data
Oct. 12, 2006      (TW) .............................. 95137584 A

(51) Int. Cl.
*G01R 15/18*      (2006.01)
(52) U.S. Cl. ...................................... 324/127
(58) Field of Classification Search .................. 324/127
See application file for complete search history.

(56) References Cited
U.S. PATENT DOCUMENTS 4,156,363 A * 5/1979 Suzuki et al. ............ 73/861.16
4,213,077 A * 7/1980 Hornung et al. ............. 318/245
4,513,274 A * 4/1985 Halder ....................... 336/173
6,087,922 A * 7/2000 Smith ......................... 336/223
2004/0183642 A1 * 9/2004 Suzui ......................... 336/192

* cited by examiner

*Primary Examiner*—Ha Tran T Nguyen
*Assistant Examiner*—Roberto Velez

(57) ABSTRACT

An integrated current sensing transformer includes a bobbin, a magnetic core assembly, a first primary winding element, a second primary winding element, a secondary winding element. The bobbin has a receptacle therein. The magnetic core assembly is partially embedded into the receptacle for providing a closed path of magnetic flux. The first primary winding element is wound around the bobbin for inputting a first test current therein. The second primary winding element is wound around the bobbin for inputting a second test current therein. The secondary winding element is wound around the bobbin for outputting a sensing current when either the first test current or the second test current is sensed. The magnitude of the sensing current is directly proportional to the magnitude of the first test current or the second test current.

8 Claims, 7 Drawing Sheets

INTEGRATED CURRENT SENSING TRANSFORMER AND CURRENT SENSING CIRCUIT USING SUCH TRANSFORMER

FIELD OF THE INVENTION

The present invention relates to a current sensing transformer, and more particularly to an integrated current sensing transformer for sensing two loop circuits.

BACKGROUND OF THE INVENTION

For most electronic devices, reliable and stable power is necessary. For maintaining desirable performance of the power system, a current sensor is widely used to sense the current status of the power system. Moreover, the current sensor may be applied to other electronic circuits in order to achieve desirable performance of the electronic circuits.

Generally, the current sensors are classified into two types, i.e. a resistor-based current sensor and a current sensing transformer.

Referring to FIG. 1, a schematic circuit configuration of a resistor-based current sensor is illustrated. For measuring the current I passing through the test circuit, a test resistor R is connected to the test circuit in series and a potential difference V across the test resistor R is measured. According to Ohm's law, the current I passing through the test resistor R is directly proportional to the potential difference applied across the test resistor R (i.e. I=V/R). The resistor-based current sensor is simple for current measurement. When current flows through the test resistor R, the electrical energy will be converted to heat and thus the temperature of the test resistor R is increased. The increased temperature of the test resistor R may result in a substantial error of the measured current and thus a high power loss.

Referring to FIG. 2, a schematic circuit configuration of a current sensing transformer is illustrated. For measuring the current I passing through the test circuit, the test circuit is connected to a primary winding coil of the current sensing transformer in series. As known, the ratio of the primary amperage (I) to the secondary amperage (Iout) is in an inverse proportion to the ratio of the primary turn (Np) to the secondary turn (Ns). That is, the current I passing through the test circuit is deduced from an equation: i.e. I=Iout×(Ns/Np).

The current sensing transformer, however, is applicable to a single loop circuit. For measuring the currents passing through two loop circuits, two current sensing transformers are required.

Please refer to FIG. 3(a), which is a schematic circuit configuration illustrating two current sensing transformers used for measuring the currents of two loop circuits. A first loop circuit Lp1 is connected to a primary winding coil of the first current sensing transformer CT1 in series. A second loop circuit Lp2 is connected to a primary winding coil of the second current sensing transformer CT2 in series. When a first test current Ip1 passes through the first loop circuit Lp1, a first output current Is1 passing through the secondary winding coil of the first current sensing transformer CT1 is measured. Likewise, when a second test current Ip2 passes through the second loop circuit Lp2, a second output current Is2 passing through the secondary winding coil of the second current sensing transformer CT2 is measured. The first test current Ip1 and the second test current Ip2 may be deduced from the equations: Ip1=Is1×(Ns1/Np1) and Ip2=Is2×(Ns2/Np2), respectively. In these equations, Np1 is the turn number of the primary winding coil of the first current sensing transformer CT1, Ns1 is the turn number of the secondary winding coil of the first current sensing transformer CT1, Np2 is the turn number of the primary winding coil of the second current sensing transformer CT2, and Ns2 is the turn number of the secondary winding coil of the second current sensing transformer CT2. The currents Ip1, Is1, Ip2 and Is2 are plotted in FIG. 3(b). As known, using two current sensing transformers for measuring the currents of two loop circuits is not cost-effective. In addition, the overall volume and the overall weight of the electronic device are increased.

In views of the above-described disadvantages resulted from the prior art, the applicant keeps on carving unflaggingly to develop a current sensing transformer according to the present invention through wholehearted experience and research.

SUMMARY OF THE INVENTION

It is an object of the present invention to provide an integrated current sensing circuit for sensing two test loop circuits by using a single transformer so as to reduce cost, volume and weight of the electronic device having such a transformer.

In accordance with an aspect of the present invention, there is provided an integrated current sensing transformer for sensing at least two test loop circuits. The integrated current sensing transformer includes a bobbin, a magnetic core assembly, a first primary winding element, a second primary winding element, a secondary winding element. The bobbin has a receptacle therein. The magnetic core assembly is partially embedded into the receptacle for providing a closed path of magnetic flux. The first primary winding element is wound around the bobbin for inputting a first test current therein. The second primary winding element is wound around the bobbin for inputting a second test current therein. The secondary winding element is wound around the bobbin for outputting a sensing current when either the first test current or the second test current is sensed. The magnitude of the sensing current is directly proportional to the magnitude of the first test current or the second test current.

In an embodiment, the magnetic core assembly includes a first magnetic part and a second magnetic part.

In an embodiment, the magnetic core assembly is an EE-type core assembly or an EI-type core assembly.

In an embodiment, the bobbin is made of insulating material.

In an embodiment, the bobbin further includes a base for supporting a plurality of pin leads.

In an embodiment, the first primary winding element, the second primary winding element and the secondary winding element are made of winding coils.

In an embodiment, the ends of the first primary winding element, the second primary winding element and the secondary winding element are connected to the pin leads, which are fixed on the base.

In an embodiment, the first primary winding element and the second primary winding element are made of copper foils having pins.

In an embodiment, the ratio of the sensing current to the first test current is equal to the turn ratio of the first primary winding element to the secondary winding element.

In an embodiment, the ratio of the sensing current to the second test current is equal to the turn ratio of the second primary winding element to the secondary winding element.

In an embodiment, the first primary winding element and the secondary winding element are wound around the bobbin along a first direction, and the second primary winding element is wound around the bobbin along a second direction. The first direction is opposite to the second direction.

In accordance with another aspect of the present invention, there is provided an integrated current sensing circuit for sensing at least two test loop circuits. The integrated current sensing circuit includes a current sensing transformer and a rectifying circuit. The current sensing transformer includes a first primary winding element, a second primary winding element and a secondary winding element. A sensing current is outputted from the secondary winding element when either a first test current is inputted into the first primary winding element or a second test current is inputted into the second primary winding element. The ratio of the sensing current to the first test current is equal to a first value and the ratio of the sensing current to the second test current is equal to a second value. The rectifying circuit is used for rectifying the sensing current into a first measuring current or a second measuring current when the first test current or the second test current is sensed. The rectifying circuit includes a first input end, a second input end, a first output end, a second output end and a common node. The first input end and the second input end are coupled to both terminals of the secondary winding element. The first measuring current is outputted from the first output end, and the second measuring current is outputted from the second output end. The ratio of the first measuring current to the first test current is equal to the first value, and the ratio of the second measuring current to the second test current is equal to the second value.

In an embodiment, the rectifying circuit further includes a first rectifying element and a second rectifying element. The first rectifying element has a positive electrode connected to the common node and a negative electrode connected to the second input end and the second output end. The second rectifying element has a positive electrode connected to the common node and a negative electrode connected to the first input end and the first output end.

Preferably, the first rectifying element and the second rectifying element are diodes.

In an embodiment, the rectifying circuit further includes a first impedance element and a second impedance element. The first impedance element is connected to the first output end and the common node. The second impedance element is connected to the second output end and the common node.

Preferably, the first impedance element and the second impedance element are resistors.

In an embodiment, the first value is equal to the turn ratio of the first primary winding element to the secondary winding element, and the second value is equal to the turn ratio of the second primary winding element to the secondary winding element.

In an embodiment, the sensing current includes a first sensing current and a second sensing current. The first sensing current is outputted from the secondary winding element when the first test current is inputted into the first primary winding element. The second sensing current is outputted from the secondary winding element when the second test current is inputted into the second primary winding element.

In an embodiment, the first sensing current is equal to the first measuring current, and the second sensing current is equal to the second measuring current.

The above contents of the present invention will become more readily apparent to those ordinarily skilled in the art after reviewing the following detailed description and accompanying drawings, in which:

BRIEF DESCRIPTION OF THE DRAWINGS

FIG. 3($b$) is a timing waveform diagram illustrating the corresponding signals of the first test current Ip1, the second test current Ip2, first sensing current Is1 and the second sensing current Is2;

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
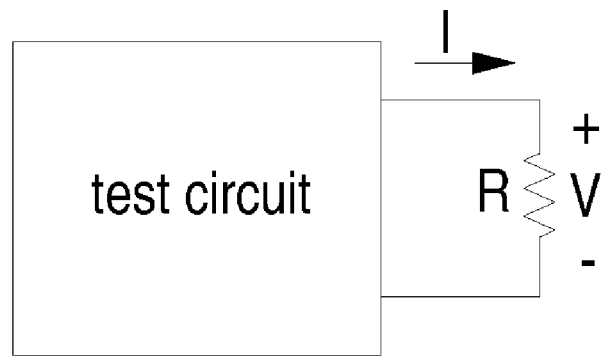
FIG. 1 is a schematic circuit configuration of a resistor-based current sensor.
Figure 2:
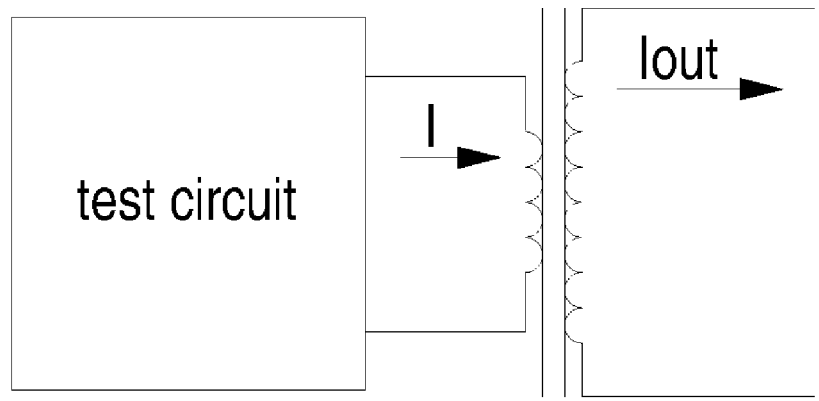
FIG. 2 is a schematic circuit configuration of a current sensing transformer.
Figure 3A:
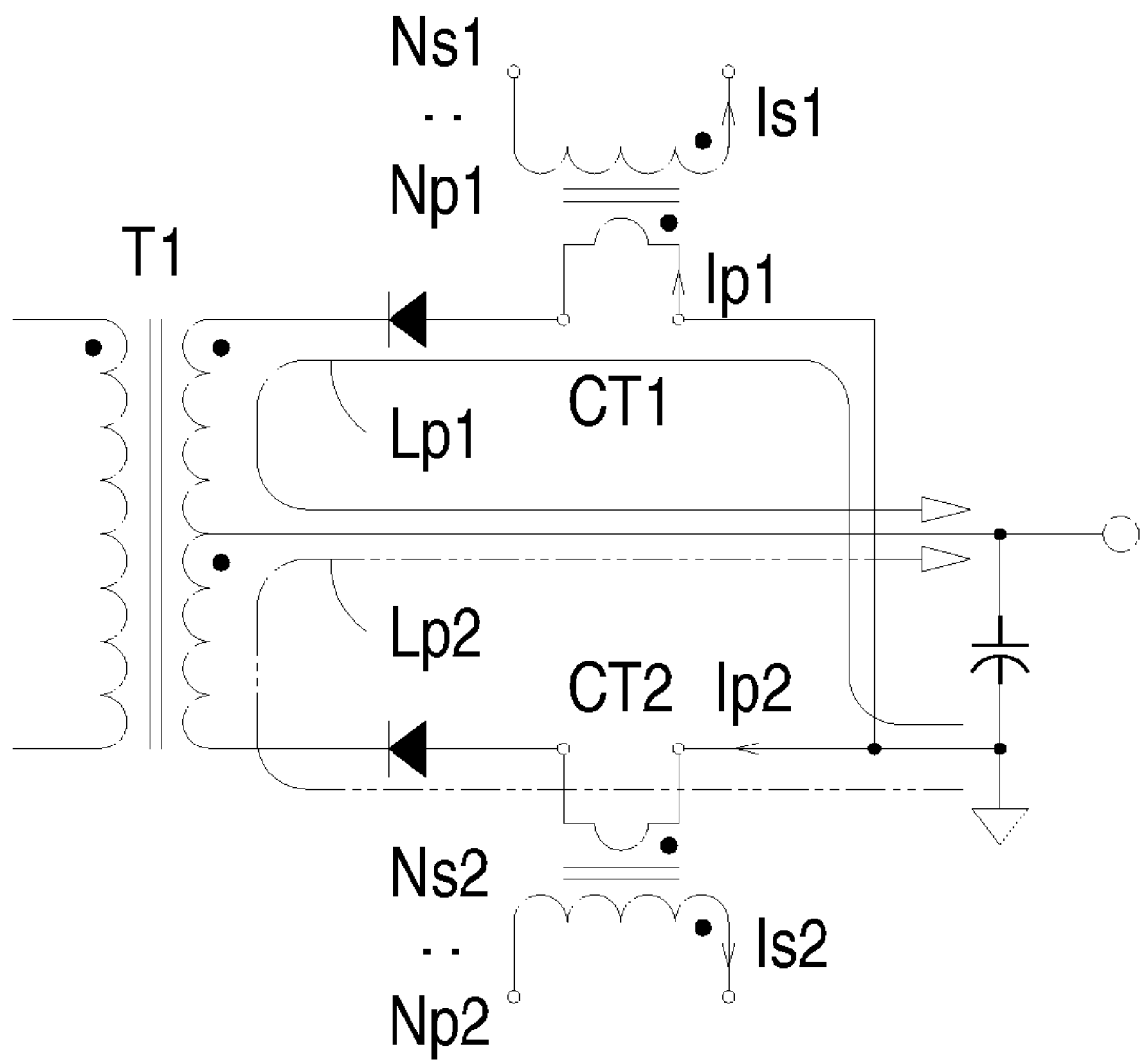
FIG. 3($a$) is a schematic circuit configuration illustrating two current sensing transformers used for measuring the currents of two loop circuits.
Figure 3B:
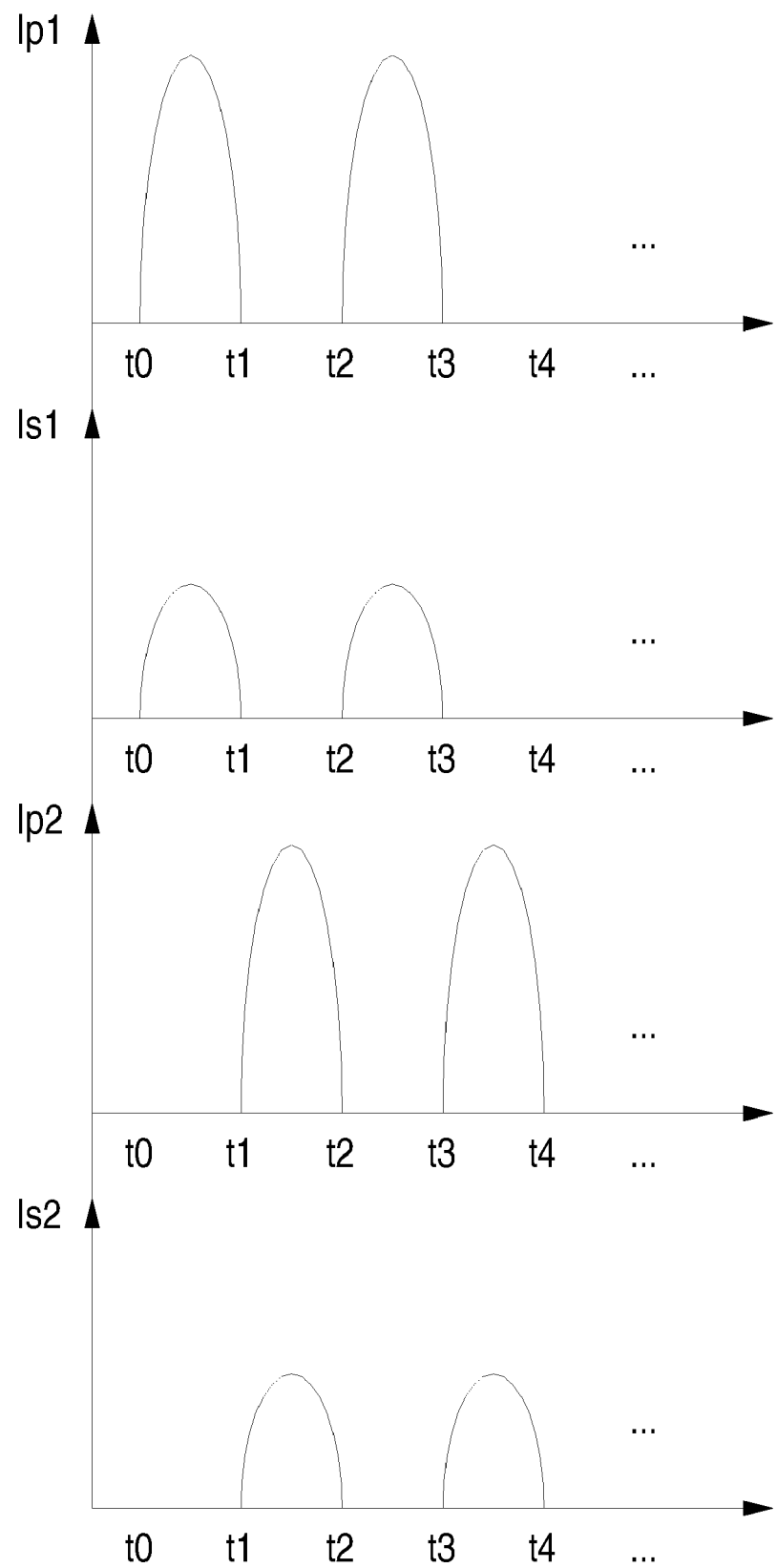
Figure 4:
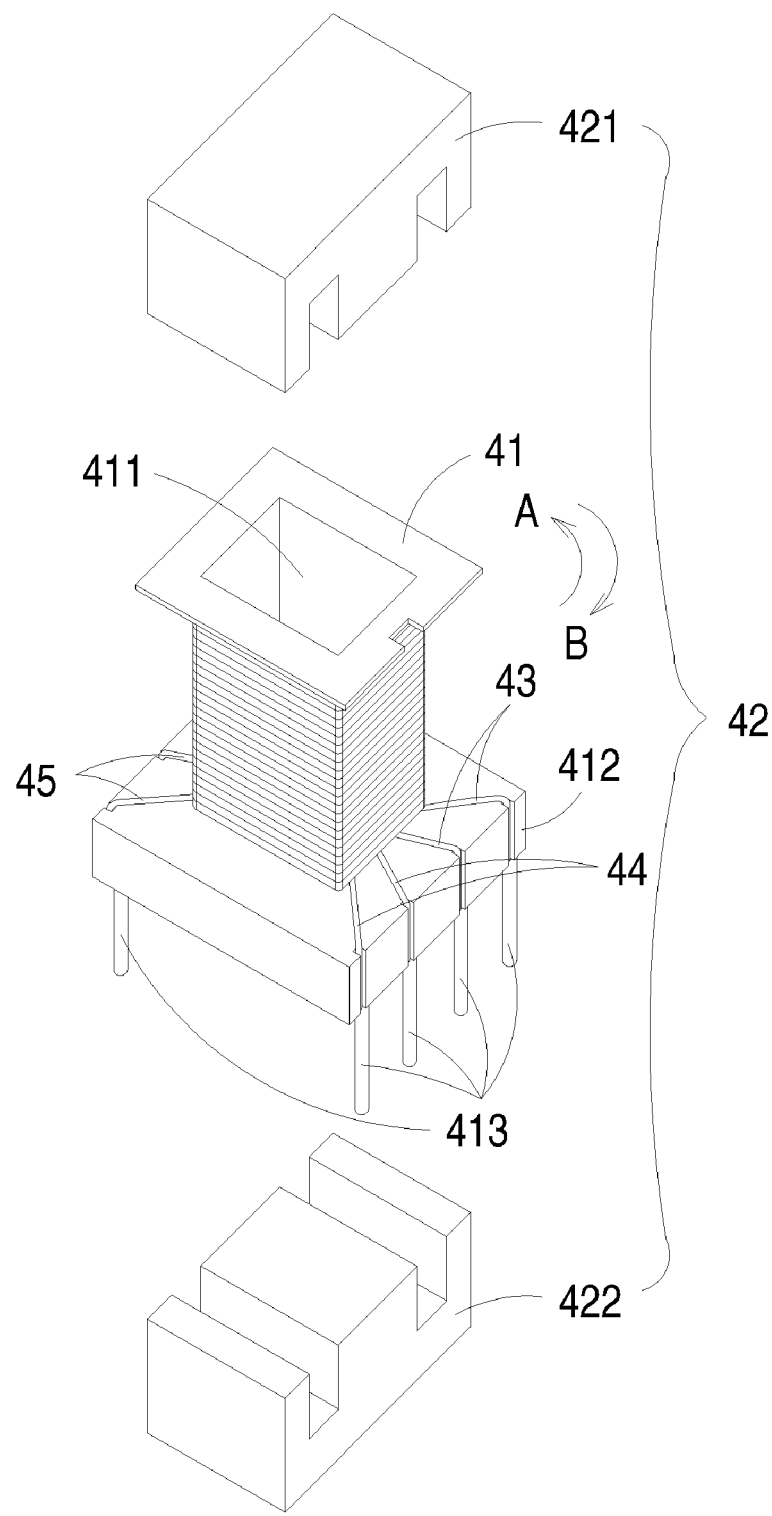
FIG. 4 is a schematic exploded view of an integrated current sensing transformer according to a preferred embodiment of the present invention.

Referring to FIG. 4, a schematic exploded view of an integrated current sensing transformer according to a preferred embodiment of the present invention is illustrated. The integrated current sensing transformer 4 principally comprises a bobbin 41, a magnetic core assembly 42, a first primary winding element 43, a second primary winding element 44 and a secondary winding element 45. The bobbin 41 is made of insulating material and includes a receptacle 411. The first primary winding element 43, the second primary winding element 44 and the secondary winding element 45 are wound around the bobbin 41. In an embodiment, the first primary winding element 43, the second primary winding element 44 and the secondary winding element 45 are made of winding coils. In another embodiment, the first primary winding element 43 and the second primary winding element 44 are made of copper foils having pins. The magnetic core assembly 42 of the transformer 4 includes a first magnetic part 421 and a second magnetic part 422, which are cooperatively formed as for example an EE-type core assembly or an EI-type core assembly. The middle portions of the first magnetic part 421 and a second magnetic part 422 are embedded into the receptacle 411 of the bobbin 41. The magnetic core assembly 42 interacts with the winding elements 43, 44 and 45 to provide a closed path of magnetic flux, thereby achieving the purpose of voltage regulation. The ends of the first primary winding element 43, the second primary winding element 44 and the secondary winding element 45 are connected to the pin leads 413, which are fixed on the bobbin base 412.

In a case that the test current is relatively large, the first primary winding element 43 and the second primary winding element 44 may be made of copper. After the pin leads 413 are soldered onto the conductive trace on a circuit board, the transformer 4 is fixed on and electrically to the circuit board. The first primary winding element 43 and the secondary winding element 45 are wound around a winding section of the bobbin 41 along a first direction A. The second primary winding element 44 is wound around the winding section of the bobbin 41 along a second direction B, which is opposite to the first direction A. When a first test current Ip1 passes through the first primary winding element 43 or a second test current Ip2 passes through the second primary winding element 44, a sensing current Is passing through the secondary winding element 45 is detected. The magnitude of the sensing current Is is directly proportional to the first test current Ip1 or the second test current Ip2. The ratio of the sensing current Is to the first test current Ip1 is equal to the turn ratio of the first primary winding element 43 to the secondary winding element 45. The ratio of the sensing current Is to the second test current Ip2 is equal to the turn ratio of the second primary winding element 44 to the secondary winding element 45.

Figure 5:
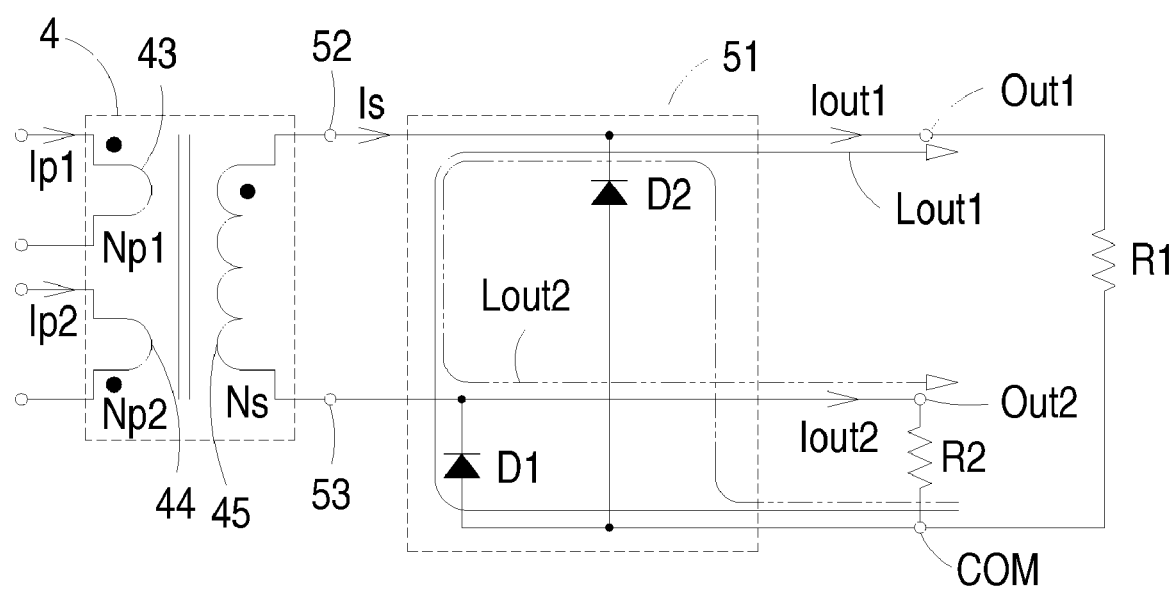
FIG. 5 is a schematic circuit configuration of an integrated current sensing circuit using the transformer of FIG. 4.

Referring to FIG. 5, a schematic circuit configuration of an integrated current sensing circuit according to a preferred embodiment of the present invention is illustrated. The integrated current sensing circuit of FIG. 5 includes the integrated current sensing transformer 4 and a rectifying circuit 51. For clarification, the first primary winding element 43, the second primary winding element 44 and the secondary winding element 45 included in the transformer 4 are shown. In addition, the first primary winding element 43 is connected to a first test loop circuit to have the first test current Ip1 pass therethrough, and the second primary winding element 44 is connected to a second test loop circuit to have the second test current Ip2 pass therethrough. The symbols Np1, Np2 and Ns indicate the turn numbers of the first primary winding element 43, the second primary winding element 44 and the secondary winding element 45, respectively.

The rectifying circuit 51 includes a first rectifying element D1 and a second rectifying element D2. Examples of the first rectifying element D1 and the second rectifying element D2 are diodes. The positive electrode of the first rectifying element D1 and the positive electrode of the second rectifying element D2 are electrically connected to a common node COM. The negative electrode of the first rectifying element D1 is connected to the second input end 53 and the second output end Out2 of the rectifying circuit 51. The negative electrode of the second rectifying element D2 is connected to the first input end 52 and the first output end Out1 of the rectifying circuit 51. By means of the rectifying circuit 51, the sensing current Is is divided into a first sensing current Is1 (Iout1) and a second sensing current Is2 (Iout2).

The integrated current sensing circuit further includes a first impedance element R1 and a second impedance element R2. The first impedance element R1 is connected to the first output end Out1 of the rectifying circuit 51 and the common node COM. The second impedance element R2 is connected to the second output end Out2 of the rectifying circuit 51 and the common node COM. Via the first impedance element R1 and the second impedance element R2, a closed loop is rendered. Examples of the first impedance element R1 and the second impedance element R2 are resistors.

As is also shown in FIG. 5, the first sensing current Is1 is outputted from the first output end Out1, and the second sensing current Is2 is outputted from the second output end Out2. The first sensing current Is1 (i.e. the first measuring current Iout1) flows through a first loop circuit Lout1 including the first output end Out1, the first impedance element R1 and the common node COM. The second sensing current Is2 (i.e. the second measuring current Iout2) flows through a second loop circuit Lout2 including the second output end Out2, the second impedance element R2 and the common node COM. The relation between the first test current Ip1 and the first measuring current Iout1 is obtained from the equation: $Iout1=Is1=Ip1\times(Np1/Ns)$. The relation between the second test current Ip2 and the second measuring current Iout2 is obtained from the equation: $Iout2=Is2=Ip2\times(Np2/Ns)$. By using these equations, the first test current Ip1 and the second test current Ip2 are deduced.

Figure 6:
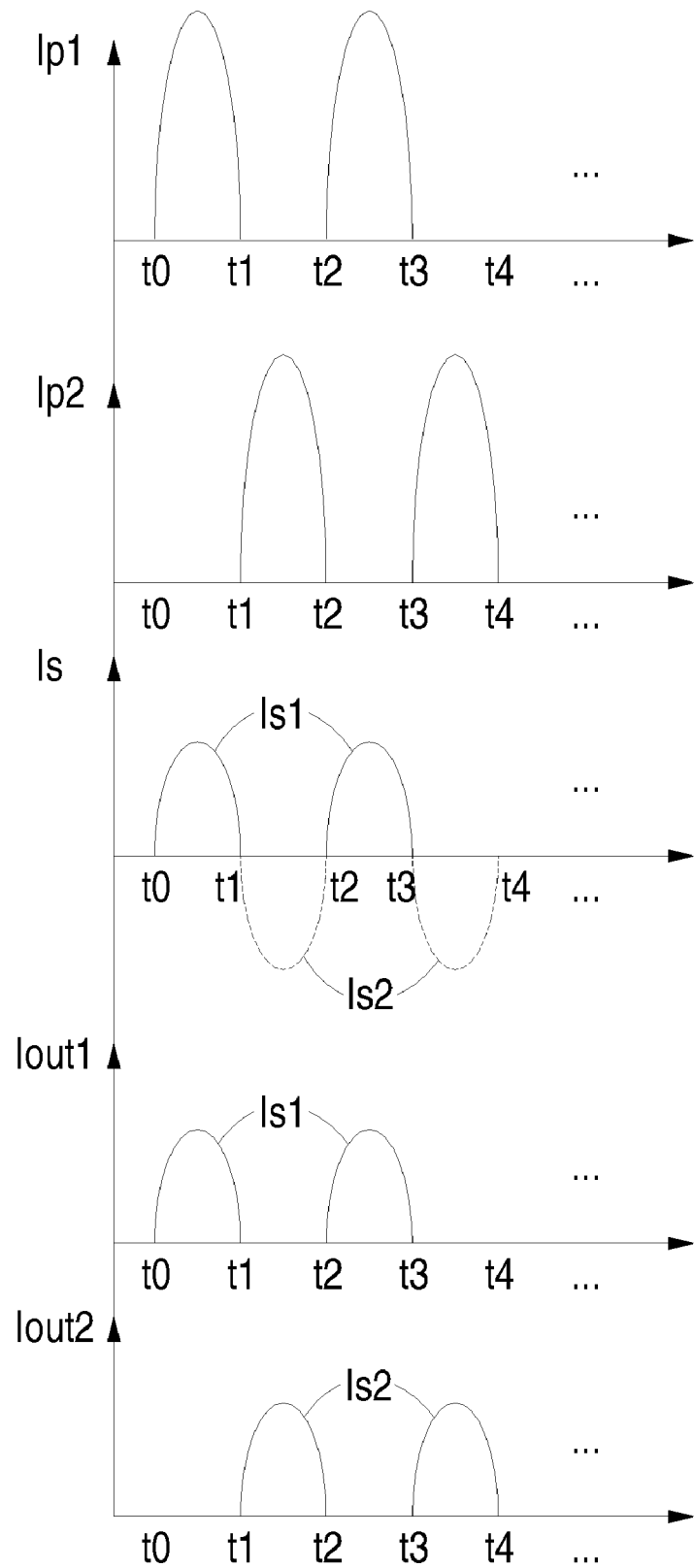
FIG. 6 is a timing waveform diagram illustrating the corresponding signals of the first test current Ip1, the second test current Ip2, the sensing current Is, the first measuring current Iout1 and the second measuring current Iout2.

FIG. 6 is a timing waveform diagram illustrating the corresponding signals of the first test current Ip1, the second test current Ip2, the sensing current Is, the first measuring current Iout1 and the second measuring current Iout2. From $t=t0$ to $t=t1$, the first test current Ip1 is inputted into the first primary winding element 43, and the second test current Ip2 is zero. Meanwhile, the first sensing current Is1 passing through the secondary winding element 45 is measured. From $t=t1$ to $t=t2$, the second test current Ip2 is inputted into the second primary winding element 44, and the first test current Ip1 is zero. Meanwhile, the second sensing current Is2 passing through the secondary winding element 45 is measured. The ratio of the first sensing current Is1 to the first test current Ip1 (i.e. Is1/Ip1) is equal to the turn ratio of the first primary winding element 43 to the secondary winding element 45 (i.e. Np1/Ns). Similarly, the ratio of the second sensing current Is2 to the second test current Ip2 (i.e. Is2/Ip2) is equal to the turn ratio of the second primary winding element 44 to the secondary winding element 45 (i.e. Np2/Ns). That is, the first sensing current $Is1=Ip1\times(Np1/Ns)$, and the second sensing current $Is2=Ip2\times(Np2/Ns)$.

Figure 7:
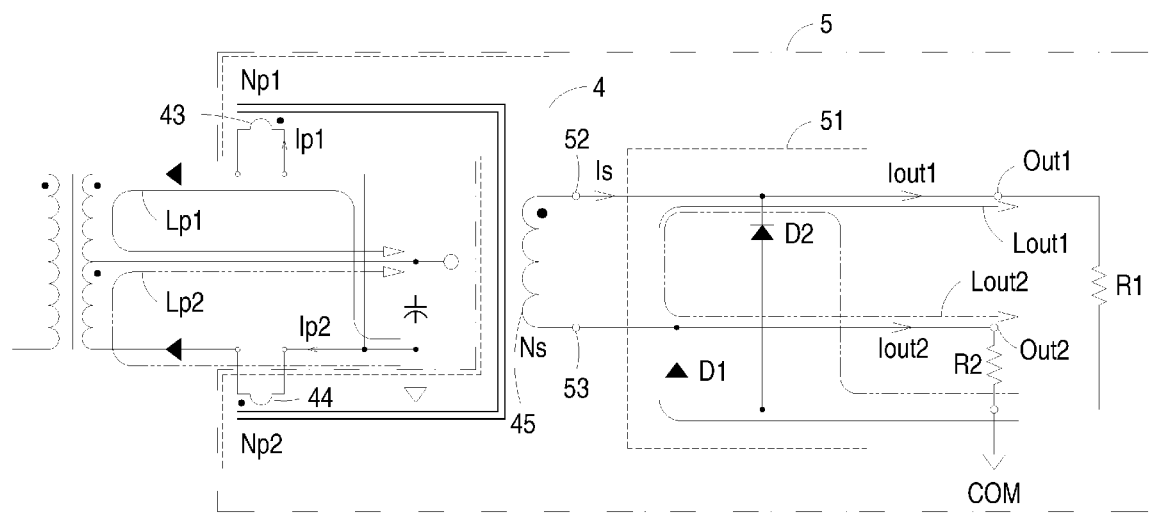
FIG. 7 is a schematic detailed circuit configuration of the integrated current sensing circuit of FIG. 5.

Referring to FIG. 7, a schematic detailed circuit configuration of the integrated current sensing circuit is illustrated. The rectifying circuit 51 included therein is similar to that shown in FIG. 5, and is not redundantly described herein. As shown in FIG. 7, the first primary winding element 43 is connected to the first test loop circuit Lp1 in series, and the second primary winding element 44 is connected to the second test loop circuit Lp2 in series. When the first test current Ip1 is inputted into the first primary winding element 43, the first sensing current Is1 passing through the secondary winding element 45 is measured. When the second test current Ip2 is inputted into the second primary winding element 44, the second sensing current Is2 passing through the secondary winding element 45 is measured. Afterwards, the first sensing current Is1 flowing through the first loop circuit Lout1 and the second sensing current Is2 flowing through the second loop circuit Lout2 are obtained from the equations: $Is1=Ip1\times(Np1/Ns)$ and $Is2=Ip2\times(Np2/Ns)$.

From the above description, the integrated current sensing circuit of the present invention is capable of sensing two test loop circuits by using the integrated transformer of the present invention. As a consequence, the integrated current sensing circuit is cost-effective and has reduced volume and weight.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An integrated current sensing circuit for sensing at least two test loop circuits, said integrated current sensing circuit comprising: a current sensing transformer including a first primary winding element, a second primary winding element and a secondary winding element, wherein a sensing current is outputted from said secondary winding element when either a first test current is inputted into said first primary winding element or a second test current is inputted into said second primary winding element, wherein in the case where said first test current is inputted into said first primary winding element, the ratio of said sensing current to said first test current is equal to a first value, and wherein in the case where said second test current is inputted into said second primary winding element, the ratio of said sensing current to said second test current is equal to a second value; and a rectifying circuit for rectifying said sensing current into a first measuring current or a second measuring current when said first test current or said second test current is sensed, wherein said rectifying circuit includes a first input end, a second input end, a first output end, a second output end and a common node, said first input end and said second input end are coupled to both terminals of said secondary winding element, said first measuring current is outputted from said first output end, and said second measuring current is outputted from said second output end, wherein in the case where said first test current is sensed, the ratio of said first measuring current to said first test current is equal to said first value, and wherein in the case where said second test current is sensed, the ratio of said second measuring current to said second test current is equal to said second value.

2. The integrated current sensing circuit according to claim 1 wherein said rectifying circuit further includes:
   a first rectifying element having a positive electrode connected to said common node and a negative electrode connected to said second input end and said second output end; and
   a second rectifying element having a positive electrode connected to said common node and a negative electrode connected to said first input end and said first output end.

3. The integrated current sensing circuit according to claim 2 wherein said first rectifying element and said second rectifying element are diodes.

4. The integrated current sensing circuit according to claim 1 wherein said rectifying circuit further includes:
   a first impedance element connected to said first output end and said common node; and
   a second impedance element connected to the second output end and said common node.

5. The integrated current sensing circuit according to claim 4 wherein said first impedance element and said second impedance element are resistors.

6. The integrated current sensing circuit according to claim 1 wherein said first value is equal to the turn ratio of said first primary winding element to said secondary winding element, and said second value is equal to the turn ratio of said second primary winding element to said secondary winding element.

7. The integrated current sensing circuit according to claim 1 wherein said sensing current includes:
   a first sensing current outputted from said secondary winding element when said first test current is inputted into said first primary winding element; and
   a second sensing current outputted from said secondary winding element when said second test current is inputted into said second primary winding element.

8. The integrated current sensing circuit according to claim 7 wherein said first sensing current is equal to said first measuring current, and said second sensing current is equal to said second measuring current.

* * * * *